United States Patent [19]

Ikezawa et al.

[11] Patent Number: 5,573,591
[45] Date of Patent: Nov. 12, 1996

[54] METHOD OF EXHAUSTING SILICON OXIDE

[75] Inventors: Kazuhiro Ikezawa; Hiroshi Yasuda; Akira Tanikawa; Hiroyuki Kojima; Koji Hosoda, all of Tokyo; Yoshifumi Kobayashi, Saitama, all of Japan

[73] Assignees: Mitsubishi Materials Silicon Corporation; Mitsubishi Materials Corporation, both of Tokyo, Japan

[21] Appl. No.: 425,444

[22] Filed: Apr. 20, 1995

Related U.S. Application Data

[62] Division of Ser. No. 187,551, Jan. 28, 1994.

[30] Foreign Application Priority Data

Jan. 28, 1993 [JP] Japan ................................. 5-12668

[51] Int. Cl.⁶ ................................................. C30B 15/20
[52] U.S. Cl. ......................................... 117/20; 117/13
[58] Field of Search ............................ 117/13, 20, 31, 117/34, 208, 213, 217, 218, 916

[56] References Cited

U.S. PATENT DOCUMENTS

| | | | |
|---|---|---|---|
| 4,097,329 | 6/1978 | Stock et al. .......................... | 117/13 |
| 4,330,361 | 5/1982 | Kuhn-Kuhnenfeld et al. ........... | 117/30 |
| 4,330,362 | 5/1982 | Zulehner ................................. | 117/33 |
| 4,944,834 | 7/1990 | Tada et al. ............................ | 117/31 |
| 4,956,153 | 9/1990 | Yamagishi et al. ................. | 117/217 |
| 5,009,863 | 4/1991 | Shima et al. ........................ | 117/213 |
| 5,087,429 | 2/1992 | Kamio et al. ....................... | 117/213 |
| 5,126,114 | 6/1992 | Kamio et al. ....................... | 117/213 |
| 5,129,986 | 7/1992 | Seki et al. .......................... | 117/21 |
| 5,131,974 | 7/1992 | Oda et al. .......................... | 117/20 |
| 5,139,750 | 8/1992 | Shima et al. ...................... | 117/213 |
| 5,152,867 | 10/1992 | Kitaura et al. .................... | 117/20 |
| 5,264,189 | 11/1993 | Yamashita et al. ................ | 117/204 |

FOREIGN PATENT DOCUMENTS

| | | |
|---|---|---|
| 0191111 | 8/1986 | European Pat. Off. . |
| 1100087 | 4/1989 | Japan . |
| 1100086 | 4/1989 | Japan . |
| 3275586 | 12/1991 | Japan . |

*Primary Examiner*—R. Bruce Breneman
*Assistant Examiner*—Felisa Garrett
*Attorney, Agent, or Firm*—Birch, Stewart, Kolasch & Birch, LLP

[57] ABSTRACT

A monocrystal pulling apparatus according to the Czochralski technique, provided with a flow controller which guides a carrier gas supplied from the top of a pulling cheer to the surface of a melt of a material forming the monocrystal and exhausts the silicon oxide vaporizing from the surface of the melt to the outside of the pulling chamber and which surrounds the pulled monocrystal near the surface of the melt and is provided partially inside a crucible, wherein the flow controller has a tubular portion which has an outer diameter smaller than the inner diameter of the crucible and extends substantially perpendicularly along the direction of downward flow of the carrier gas, a constricted diameter portion which constricts in diameter from the bottom end of the tubular portion and forms a bottom gap with the pulled monocrystal, and an engagement portion which projects out from the top of the tubular portion and forms a top gap at the outer circumference of the tubular portion of the flow controller by supporting the flow controller partially in the pulling chamber. As a result, a first flow path through which the carrier gas flows toward said bottom gap is defined between the inside of the tubular portion and the pulled monocrystal, a second flow path is defined comprised of a flow path of the carrier gas passing through the top gap and a flow path of the carrier gas passing from the first flow path through the bottom gap and then passing between the surface of the silicon melt and flow controller. The silicon oxide is exhausted together with the carrier gas through the second flow path to the outside of the pulling chamber.

6 Claims, 15 Drawing Sheets

STATE OF FLOW
(CLOSED TYPE HEAT CAP)

TEMPERATURE DISTRIBUTION (CLOSED TYPE HEAT CAP)

FLOW STATE
$0.4 \leq Ru/Rd \leq 1.4$

TEMPERATURE DISTRIBUTION
$0.4 \leq Ru/Rd \leq 1.4$

FLOW STATE
$Ru/Rd > 1.4$

TEMPERATURE DISTRIBUTION
Ru/Rd >1.4

2 rpm 5 rpm 10 rpm

TEMPERATURE OF MELT SURFACE

METHOD OF EXHAUSTING SILICON OXIDE

This application is a divisional of copending application Ser. No. 08/187,551, filed on Jan. 28, 1994, now allowed, the entire contents of which are hereby incorporated by reference.

BACKGROUND OF THE INVENTION

1. Field of the Invention

The present invention relates to a monocrystal pulling-up system which pulls up and grows a monocrystal of silicon etc. by the Czochralski technique (hereinafter referred to as the "CZ technique"), in particular relates to a monocrystal pulling-up system which can pull a large diameter and high quality monocrystal while controlling the oxygen concentration (density) by providing a carrier gas flow controller.

The present invention also relates to a method of exhausting silicon oxide(SiO) produced from the melt silicon in a quartz crucible to the outside of a pulling chamber by controlling the flow of the carrier gas.

2. Description of the Related Art

To produce a silicon monocrystal by the CZ technique, polycrystalline silicon and the necessary dopant(s), for example, P, B, Sb, As, are inserted into a quartz crucible provided rotatably at a bottom of a pulling chamber, the chamber is evacuated to a vacuum, then a heater arranged around the quartz crucible is used to melt the polycrystalline silicon and the dopant(s). A carrier gas is then passed from an upper portion of the chamber to the quartz crucible. At the same time a seed crystal (starting crystal) attached to and supported by a chuck on a pulling shaft is immersed in the melt silicon in the quartz crucible under conditions of a vacuum of 10 to 20 Torr. Then the pulling shaft is pulled up at a predetermined speed while relatively rotating it with respect to the quartz crucible.

U.S. Pat. No. 4,330,362 discloses a pulling system provided with a member (hereinafter called a "heat cap") comprised of a material able to reflect ultraviolet rays above the crucible so as to partially cover the crucible and the melt silicon in the crucible, to thereby block the radiant heat from the melt surface, promote the formation of the monocrystal, and raise the pulling speed and to keep down the concentration of carbon in the monocrystal.

When pulling a silicon monocrystal using the above-mentioned pulling system, however, there are the following disadvantages.

First, the above heat cap can be expected to a certain extent to have the effect of controlling the flow of the carrier gas, for example, argon gas(Ar), being passed to remove the silicon oxide(SiO) produced from the melt and efficiently eliminating the silicon oxide depositing on the inner wall of the top end of the crucible, but silicon oxide ends up depositing and condensing on the top of the heat cap itself. This is a drawback in that it would fall onto the melt silicon surface and thus obstruct the formation of the silicon monocrystal. This is believed to be because the heat cap has as its main object the literal blocking of ultraviolet rays and is not designed with the intention of control of the flow of the argon gas.

Second, the melt surface near the inner peripheral wall of the quartz crucible ends up being covered by the heat cap, so an operator cannot visually inspect the melt surface from a peephole etc. provided in the-pulling chamber. As a result, there is the disadvantage that it is not possible to quickly deal with any heat deformation of the top end of the crucible, recrystallization or deposition of silicon near the inner peripheral wall of the crucible, or any other disadvantages when they occurred.

In addition, there are the following disadvantages when trying to pull a silicon monocrystal for use for the manufacture of a large diameter VLSi device, for example, a diameter of 6 inches, 8 inches, or more.

With a large diameter crystal, the most important thing is the control of the oxygen concentration (density). This is generally classified in the manufacturing process of an LSI device into high oxygen of, for example, $1.55\times10^{18}$ atoms/cm$^3$, medium oxygen of, for example, $\mathbf{1.35\times10^{18}}$ atoms/cm$^3$, and low oxygen of, for example, $1.15\times10^{18}$ atoms/cm$^3$. Further, in some cases, extremely high oxygen and extremely low oxygen are demanded and such classifications are selectively used. For example, when using the intrinsic gettering technique utilizing oxygen precipitation, much use is made of monocrystals from a high oxygen to a medium oxygen concentration. On the other hand, when strength and reduction of lattice faults are required, much use is made of monocrystals from a medium oxygen to a low oxygen concentration. Thus, it is necessary to control the variation in the oxygen concentrations in the axial direction of the crystal and in the silicon wafer surface so that the oxygen concentration of the pulled monocrystal becomes in the designated narrow range.

The "oxygen in the crystal" described here means the oxygen dissolving out from the quartz crucible. Almost of the oxygen, for example, 95% of the oxygen, becomes silicon oxide and is exhausted by the carrier gas to the outside of the pulling chamber. Therefore, the following techniques are known for the control of the oxygen concentration in the crystal:

Approach (1): Changing the rotational speed of the crucible so as to control the supply of oxygen from the wall of the quartz crucible. By this technique, if the rotational speed of the crucible is increased, the amount of oxygen of the pulled monocrystal becomes higher. However, if the rotational speed of the crucible is made lower, the temperature fluctuations of the melt become great and crystal faults become easier to occur at a low oxygen concentration. If the rotational speed of the crucible is raised to obtain a high oxygen pulled monocrystal, it is necessary to raise the rotational speed of the pulled crystal along with the same. There is a problem, however, of the resonance point in the case of pulling a pulled crystal by a wire. Further, if the rotational speed of the pulled crystal is made too high, deformation occurs in the monocrystal and there are problems in the control of the diameter of the monocrystal as well.

Approach (2): Control of the pressure of the carrier gas. If the pressure of the carrier gas is increased, the vaporization of the silicon oxide is suppressed, so the amount of oxygen of the pulled monocrystal becomes higher. However, this approach is governed largely by the structure inside the pulling furnace, so not much can be expected in terms of the response of the control of the oxygen concentration.

Approach (3): Spraying carrier gas on the melt silicon surface in the crucible-so as to control the temperature of the melt silicon surface and control the amount of vaporization of the silicon oxide. When the heat cap is used, for example, the carrier gap between the heat cap and the melt silicon surface and the gap between the heat cap and the pulled monocrystal (hereinafter referred to all together as the "bottom gap") are controlled. By this technique, if the bottom gap is made smaller, the temperature of the melt surface falls, so the amount of vaporization of the silicon oxide is held down and as a result the amount of oxygen of the pulled monocrystal becomes higher. This approach is relatively effective to obtain a high oxygen crystal, but if the flow of the carrier gas is increased and the bottom gap is made too small, the carrier gas will strike the melt hard and therefore cause bubbles in the melt. As a result, there are the problems that the crystal growth will no longer be uniform and further the variations in the oxygen concentration in the surface will become greater.

Approach (4): Control of the discharge of the vaporized silicon oxide by the flow of the carrier gas. If the vaporized silicon oxide is efficiently discharged by the carrier gas from the melt silicon surface to outside of the pulling chamber, the vaporization of the silicon oxide is promoted and as a result the oxygen concentration in the melt is lowered and the amount of oxygen in the pulled crystal becomes lower. There is a gas diffusion layer of the vaporized silicon oxide directly above the melt surface. By using the heat cap, the flow rate of the same is increased by the flow of the carrier gas introduced from above the pulling chamber in the narrowed gap between the heat cap and the melt surface and therefore the thickness of the gas diffusion layer is reduced. As a result, the partial pressure of the silicon oxide on the melt surface becomes lower and vaporization of the silicon oxide is promoted, but if a heat cap is used, an opposing phenomenon simultaneously occurs. Further, if the crucible deforms and the melt surface drops, the subsequent oxygen concentration in the crystal will change.

In addition to the disadvantages in the approach (4), in the approach (3), if the size of the bottom gap is increased, the effect of the approach (4) becomes stronger and the oxygen concentration rapidly decreases. Therefore, to control the pulled monocrystal to within the target range of oxygen concentration, it is necessary to continuously control the size of the bottom gap precisely.

In this way, when using a heat sink, there is a problem that it is always difficult to set and manage the conditions.

Further, with a silicon monocrystal used for the production of a large diameter VLSi device, it is desirable that the crystal as a whole have the same heat history as much as possible so that the concentration of the oxygen taken into the crystal becomes uniform, even during the subsequent cooling process. Therefore, a heat cap blocking the radiant heat and/or a water cooling tube are provided.

Further, there are phenomena believed to be related to the behavior of clusters of point faults directly on the growth surface having an effect on the pressure resistance of the oxide film of the device. Therefore, Japanese Unexamined Patent Publication (Kokai) No. 3-275586 discloses the production of a crystal with a high oxide film pressure resistance by lowering the pulling speed to 0.5 mm/min or less in a furnace structure with a usual pulling speed of 1.5 mm/min. This is because it is guessed that by lengthening the residence time in the temperature region of over 1300° C. from the crystal growth interface, the faults relating to the pressure resistance of the oxide film diffuse and disappear.

In view of these problems, the present inventor started studies from a completely new viewpoint smashing fixed conceptions about the heat cap disclosed in U.S. Pat. No. 4,330,362 and designed to block (shield) ultraviolet rays, that is, from the viewpoint of a "carrier gas flow controller", and analyzed the state of flow of the carrier gas using computer simulation to find a numerical solution to the Navier-Stokes equation, i.e., a non-linear fluid diffusion equation based on fluid dynamics and thermodynamics.

First, if the state of flow of carrier gas in the case of pulling a monocrystal by a pulling apparatus equipped with the heat cap disclosed in U.S. Pat. No. 4,330,362 (hereinafter referred to as a "closed type heat cap") is considered, the result becomes as shown in FIG. 1 to FIG. 3.

FIG. 1 is a view showing the state of flow of carrier gas in a pulling system equipped with a closed type heat cap, FIG. 2 is a view of the state of flow of carrier gas analyzed by computer simulation of the Navier-Stokes equation, and FIG. 3 is a view of the temperature distribution obtained by analysis by the same computer simulation.

The heat cap 30 shown in FIG. 1 completely partitions the flow path of the carrier gas G into the top (shown by region X) and bottom (shown by region Y) of a pulling chamber, so the carrier gas G introduced from the top of the pulling chamber passes through the narrow bottom gap 33 between the heat cap 30 and the pulled monocrystal 31 and surface of the melt silicon 32 to be increased in speed. By this colliding with the melt surface positioned directly under the bottom gap 33, the temperature of the melt directly under the gap 33 falls, the vaporization of silicon oxide is suppressed, and the melt 32 of the hatched portion 34 shown in FIG. 1 becomes high in oxygen, but on the other hand, the carrier gas forcibly removes the diffusion layer including the silicon oxide from the melt surface, so vaporization of silicon oxide is promoted.

In the other area of the melt 32, however, the degree of contact with the carrier gas G is smaller than with the portion 34 directly under the bottom gap 33, so the melt becomes relatively low in oxygen concentration. Therefore, the distribution of the oxygen concentration of the melt in the crucible becomes nonuniform and there is an adverse effect on the oxygen distribution (ORG) in the silicon wafer surface of the pulled monocrystal 31.

Note that this state is verified by the results of computer simulation shown in FIG. 2 and FIG. 3.

This problem, it may be concluded, derives from the way the carrier gas flows. Since the heat cap partitions the pulling chamber into a top and bottom section, the carrier gas passing through the bottom gap flows in a so-called "squished" manner.

Based on these studies and the results of analyses, the present inventor took note of the "flow-control of the carrier gas" and discovered that if the carrier gas is suitably guided in the pulling chamber, the temperature region directly above the crystal growth interface can be expanded, the control of the oxygen concentration and ORG can be improved, and the condensation and falling of silicon oxide can be prevented and thereby completed the invention disclosed in Japanese Unexamined Patent Publication (Kokai) No. 1-100,086.

A heat-cap disclosed in JPP 1-100,086 comprises a reflector body and projected stops. The reflector consists of a tube and an inclined cylinder provided at a lower portion of the tube with a tip (end) which is reduced in diameter inward. The tube and the inclined cylinder may be formed integrally or together. Projections are provided at the top of the tube and are affixed to the top of a heat retaining member provided around the crucible. The carrier gas is branched by the tube to flow, on one hand, through a gap between the pulling monocrystal and the tube, and, other hand, through a GaP between the tube and the heat retaining member. That is, the heat cap can form a flow path between the tube and the heat holding member. Thus, the heat cap can be called an open-type heat cap.

The heat cap disclosed in JPP 1-100,086 can overcome the disadvantage of U.S. Pat. No. 4,330,362 as a basic idea, but JPP 1-100,086 does not disclose specific conditions. In addition, the heat cap of JPP 1-100,086 requires some improvements.

SUMMARY OF THE INVENTION

An object of the present invention is to provide a pulling system which enables control of the oxygen concentration of the pulled monocrystal, can make the oxygen concentration (ORG) in a wafer surface uniform, can pull a monocrystal with a uniform oxygen concentration in the axial direction, and in particular can pull a large diameter monocrystal with a high quality and a uniform heat history.

Another object of the present invention is to provide a method of exhausting silicon oxide by a carrier gas effectively and a system thereof.

Still another object of the present invention is to provide an improved heat cap.

According to the present invention, there is provided a monocrystal pulling system according to the Czochralski technique, comprising: a pulling chamber; a crucible provided inside the pulling chamber; a heating means provided at the circumference of the crucible and for melting a material accommodated in the crucible for forming the monocrystal; a heat retention means provided a predetermined distance away from the heating means and for retaining the heat of the crucible; a means for supplying a carrier gas from the top of the pulling chamber toward the surface of the melt solution in the crucible; and a flow controller which guides the carrier gas to the surface of the melt of the material forming the monocrystal and exhausts the silicon oxide vaporizing from the surface of the melt solution to the outside of the pulling chamber and which surrounds the pulled monocrystal near the surface of the melt and is provided partially inside the crucible. The flow controller comprises a tubular portion which has an outer diameter smaller than the inner diameter of the crucible and extends substantially perpendicularly along the direction of downward flow of the carrier gas, a constricted diameter portion which constricts in diameter from the bottom end of the tubular portion and forms a bottom gap with the pulled monocrystal, and an engagement portion which projects out from the top of the tubular portion and forms a top gap at the outer circumference of the tubular portion of said flow controller by supporting the flow controller partially in the pulling chamber. As a result, a first flow path through which the carrier gas flows toward the bottom gap is defined between the inside of the tubular portion and the pulled up monocrystal, and a second flow path is defined comprised of a flow path of the carrier gas passing through the top gap and a flow path of the carrier gas passing from the first flow path through the bottom gap and then passing between the surface of the silicon melt solution and the flow controller. The silicon oxide is exhausted together with the carrier gas through the second flow path to the outside of the pulling chamber.

Preferably, the bottom gap and the top gap are formed so that the amount of the carrier gas flowing through the bottom gap becomes greater than the amount of the carrier gas flowing through the top gap.

Specifically, the engagement portion is affixed to the top of a heat retaining tube provided at the outer circumference of the crucible.

Preferably, a heating means for heating the crucible is arranged between the crucible and the heat retaining tube, a gap is formed between the heating means and the heat retaining tube, the gap is connected to the second flow path, and the silicon oxide is exhausted together with the carrier gas to the outside of the pulling chamber through the gap.

Preferably, the area of the opening of the constricted diameter portion is 1.5 to 2.0 times the sectional area of the pulled monocrystal.

Also, preferably, the sectional area (Ru) of the top gap is 0.5 to 1.4 times the sectional area (Rd) of the bottom gap.

Preferably, the top gap is positioned at least partially to the inside of the top end of the crucible.

Preferably, the flow controller is made of carbon.

Further preferably, the surface of said carbon flow controller is covered with silicon carbide.

The length of the tubular portion of said flow controller is greater than the range of vertical movement of said crucible.

Preferably, the tubular portion, the constricted diameter portion, and the engagement portion are integrally formed, or, the tubular portion and the constricted diameter portion are integrally formed and the engagement portion is attached detachably to the tubular portion.

Preferably, provision is made, in the pulling chamber at the top of the flow controller, of a cooling means for cooling the pulled monocrystal and introducing the carrier gas into the pulling chamber and a peephole is provided at the outer wall of the pulling chamber on the line connecting the gap between the front end of the cooling means and the front end of the top of the tubular portion of said flow controller and the bottom gap.

Also, according to the present invention, there is provided a silicon oxide exhaust method for guiding a carrier gas, supplied from the top of a pulling chamber for pulling up a monocrystal according to the Czochralski technique, to a surface of a melt of a material for forming a monocrystal and exhausting to the outside of the pulling chamber a silicon oxide vaporized from the surface of the melt accommodated in a crucible. The silicon oxide exhaust method characterized by defining by a carrier gas branching means a bottom gap of a predetermined size between a circumference of the pulled monocrystal and the surface of the melt and defining a top gap between the crucible and a heat retaining tube provided at the outside of the same, defining a first flow path through which the carrier gas flows toward the bottom gap between the carrier gas branching means and pulled monocrystal, defining a second flow path comprised of a flow path of the carrier gas passing through the top gap and a flow path of said carrier gas passing from the first flow path through the bottom gap and then passing between the surface of the silicon melt and a flow controller, forming the bottom gap and the top gap so that the amount of the carrier gas flowing through the bottom gap becomes greater than the amount of the carrier gas flowing through the top gap, and exhausting said silicon oxide together with said carrier gas through said second flow path to the outside of the pulling chamber.

Preferably, the crucible is heated by a heating means arranged between the crucible and the heat retaining tube and a gap is formed between the heating means and the heat retaining tube, the gap is connected to the second flow path, and the silicon oxide is exhausted together with the carrier gas to the outside of said pulling chamber through the gap.

Preferably, the diameter of the carrier gas branching means near the surface of the melt solution is constricted and the area of the opening of the constricted diameter portion is 1.5 to 2.0 times the sectional area of the pulled monocrystal.

Also, preferably, the sectional area (Ru) of said top gap is 0.5 to 1.4 times the sectional area (Rd) of the bottom gap.

Preferably, the top gap is positioned at least partially to the inside of the top end of the crucible.

According to the present invention, there is provided a monocrystal pulling system, further provision is made of a rotational control means for controlling the relative rotational speed of the crucible or the pulled monocrystal so as to control the concentration of oxygen included in the monocrystal.

Further, according to the present invention, there is provided a monocrystal pulling method, wherein the relative rotational speed of the crucible or the pulled monocrystal is controlled so as to control the concentration of oxygen included in the monocrystal.

To pull a large diameter and high quality monocrystal, it is necessary to (1) adjust the rotational speed of the crucible to regulate the amount of oxygen entering the melt from the wall surface of the crucible, (2) change the rotational speed of the crucible in accordance with changes in the area of the crucible wall surface so as to control the distribution of the oxygen concentration of the resultant monocrystal to be uniform, and (3) raise the temperature of the carrier gas removing the silicon oxide from the melt surface to reduce the drop in temperature at the crystal growth interface and control the radiant heat received by the crystal so as to establish a uniform heat history environment.

When pulling the monocrystal, however, the silicon oxide which condenses at the top of the pulling apparatus silicon oxide. The atmosphere including the silicon oxide is led uniformly outside by the aspiration effect of the large energy carrier gas passing through the outer portion of the flow controller (second flow path).

Consequently, by uniformly exhausting the silicon oxide vaporizing from the melt surface by a smaller amount of gas, the distribution of the oxygen concentration at the melt surface is maintained uniform, the cooling of the crystal growth surface is reduced, and as a result the pulled monocrystal is given a uniform distribution of the oxygen concentration and becomes high in quality.

BRIEF DESCRIPTION OF THE DRAWINGS

The above objects and features and other objects and features of the present invention will be more apparent with reference to the accompanying drawings, in which.

That is, the carrier gas does not flow in a squished manner as in the conventional pulling apparatus. Rather, the aspiration effect of the carrier gas passing through the second flow path formed at the outer portion of the flow controller is utilized and the carrier gas that passes through the inside of the flow controller and sweeps up and exhausts the atmosphere including the silicon oxide particles from the melt surface is used to draw this to the outer portion of the crucible.

Figure 1:
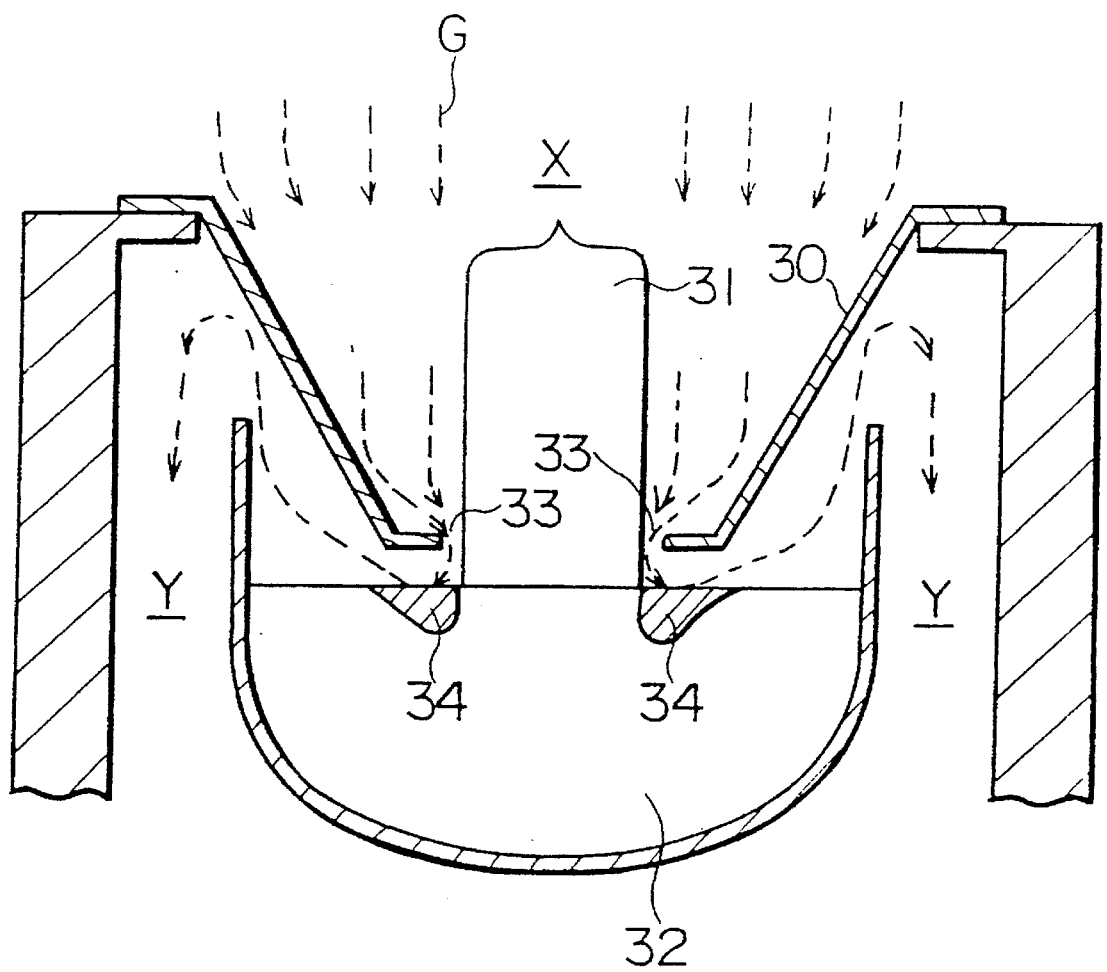
FIG. 1 is a sectional view for explaining the flow of carrier gas in a conventional pulling system provided with a closed type heat cap.
Figure 2:
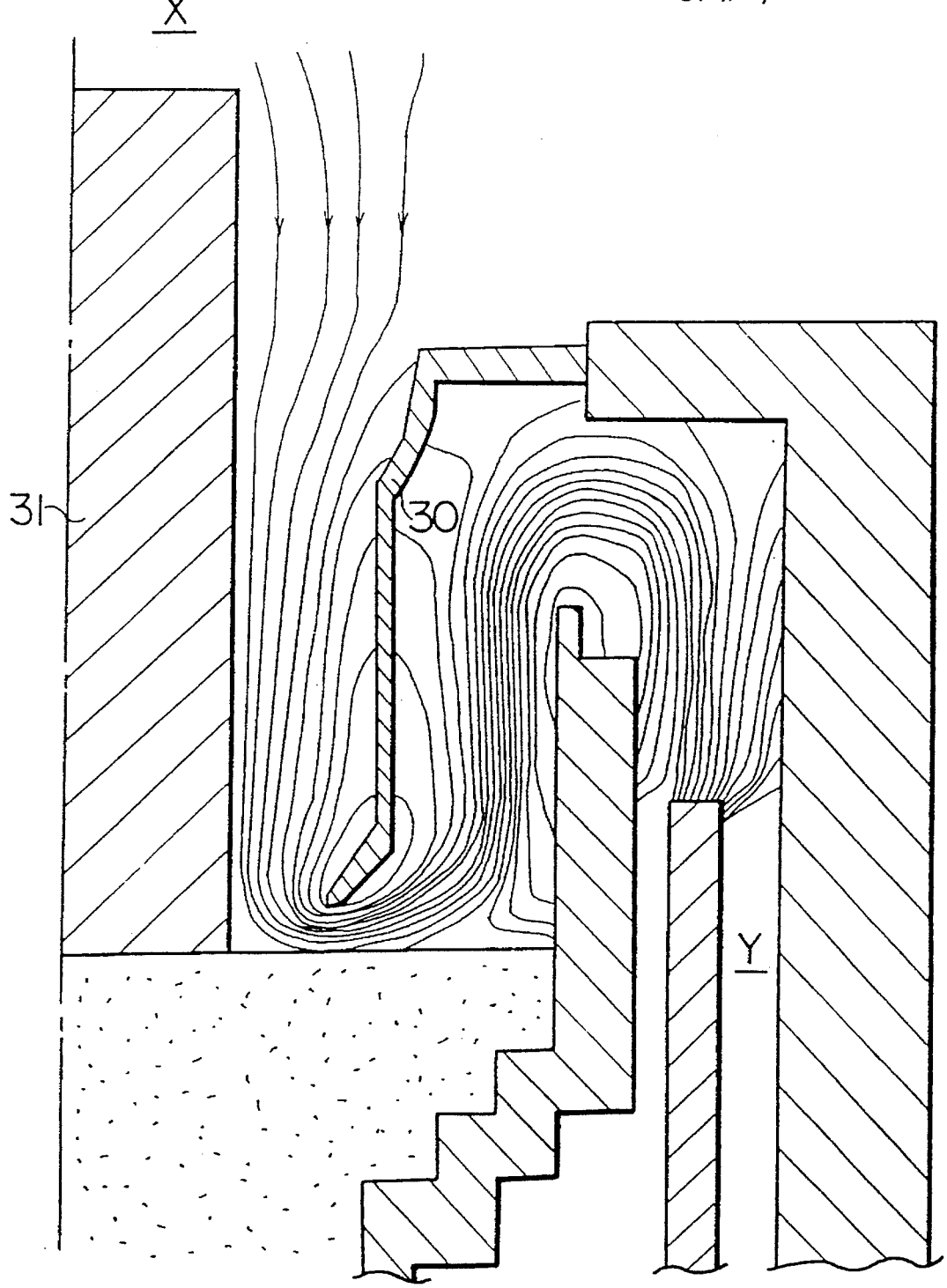
FIG. 2 is a view of the state of flow showing the results of analysis by computer simulation of the state of flow of the carrier gas using the Navier-Stokes equation for the same conventional pulling apparatus provided with a closed type heat cap.
Figure 3:
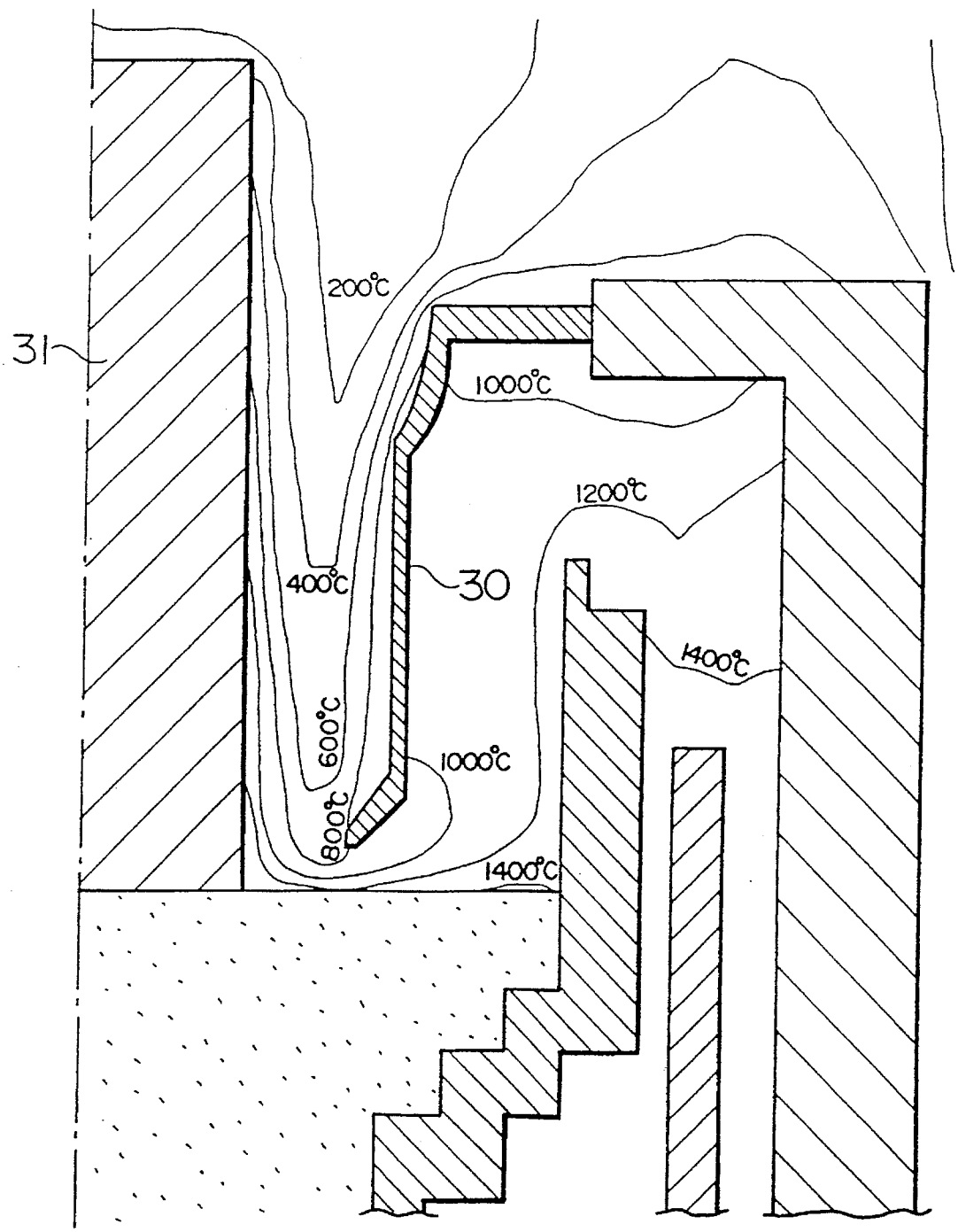
FIG. 3 is a view of the temperature distribution and at the crystal surface and falls into the melt becomes a cause of ruin of the monocrystal, so it is critical to exhaust the vaporized silicon oxide by the carrier gas out of the system quickly and smoothly. In the present invention, by providing a suitably constructed flow controller, the optimal flow of carrier gas is realized, the amount of vaporization of the silicon oxide is made constant, and the particles of the silicon oxide pass between a graphite susceptor and heat shield and between the heat shield and heater and are exhausted by a vacuum pump without condensing and solidifying.
Figure 4:
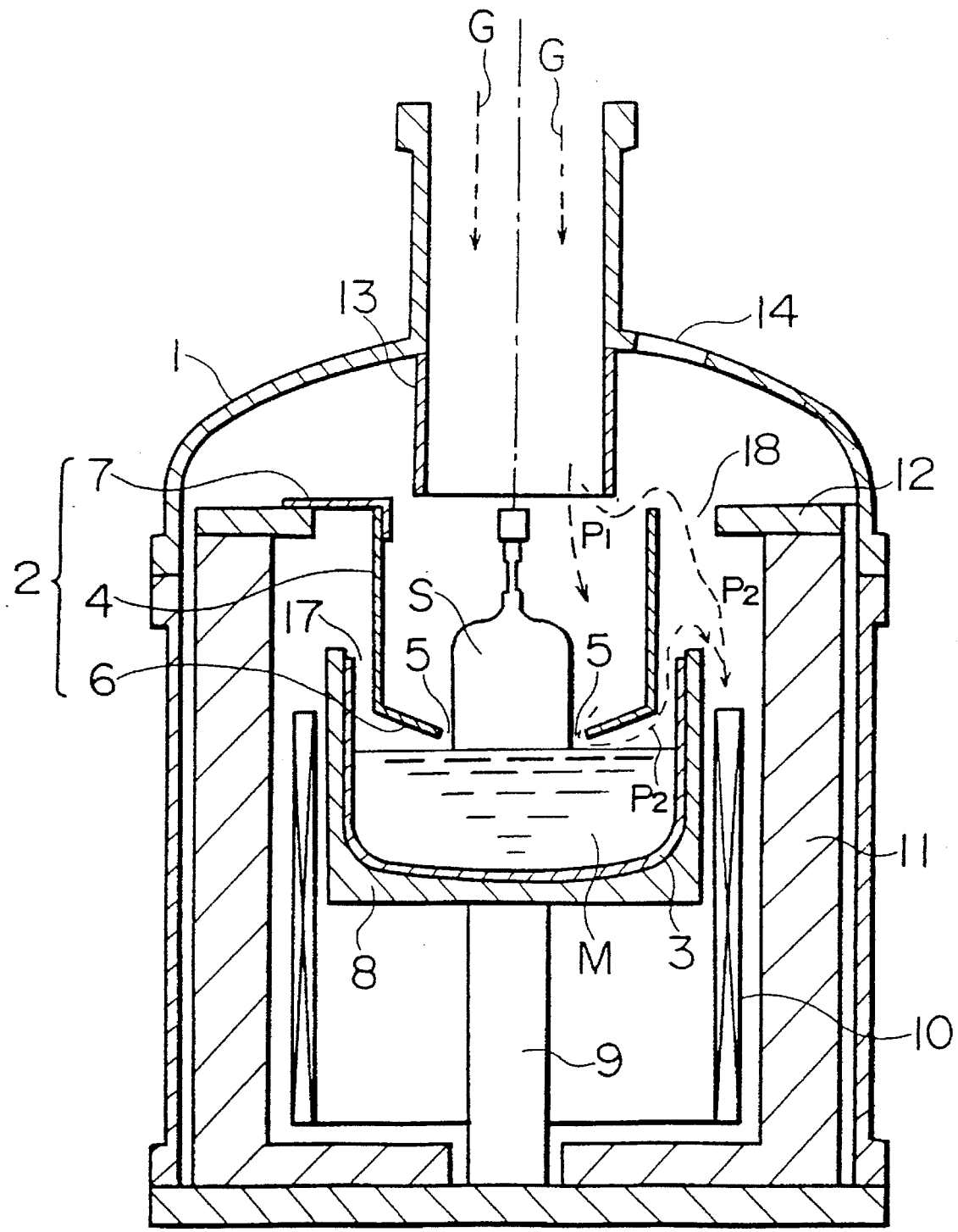
Figure 5:
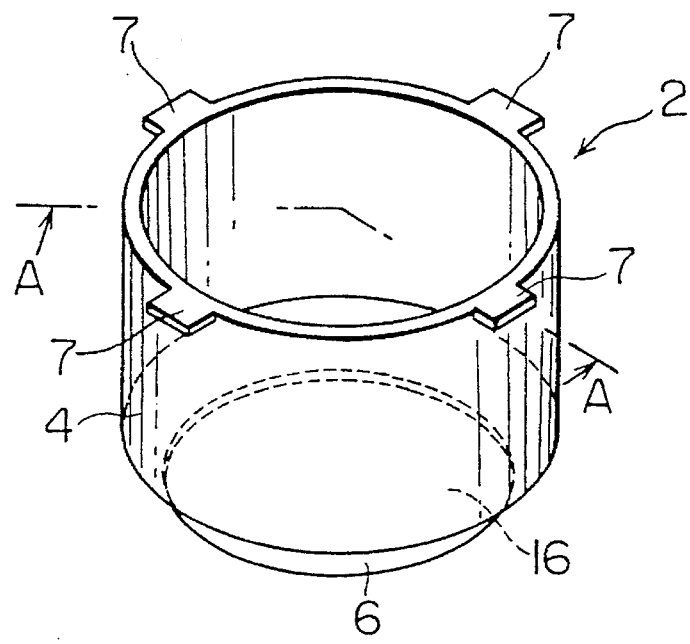
Figure 6:
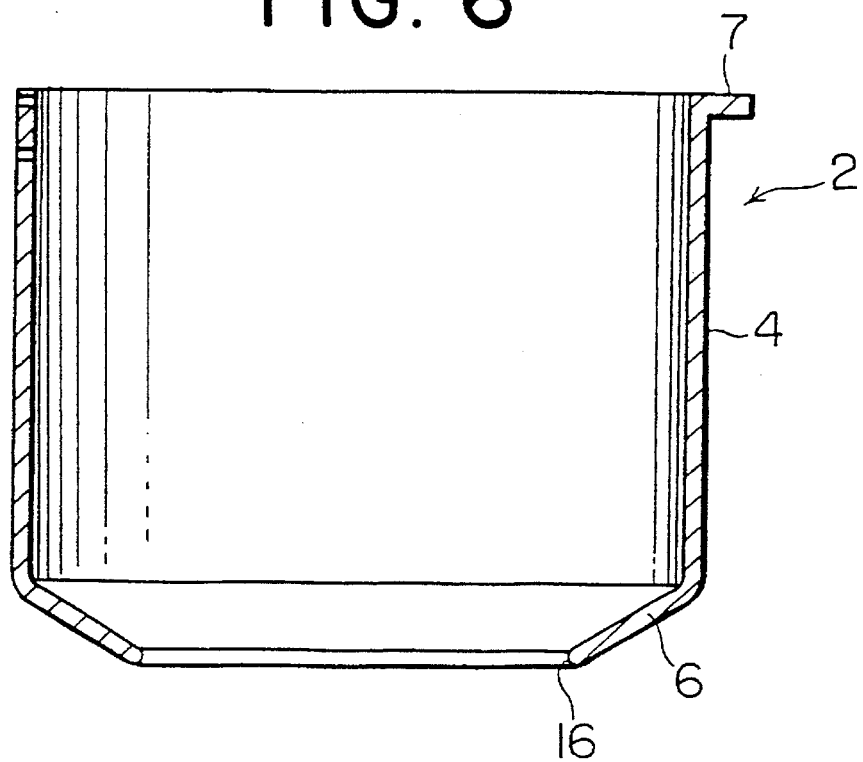
Figure 7:
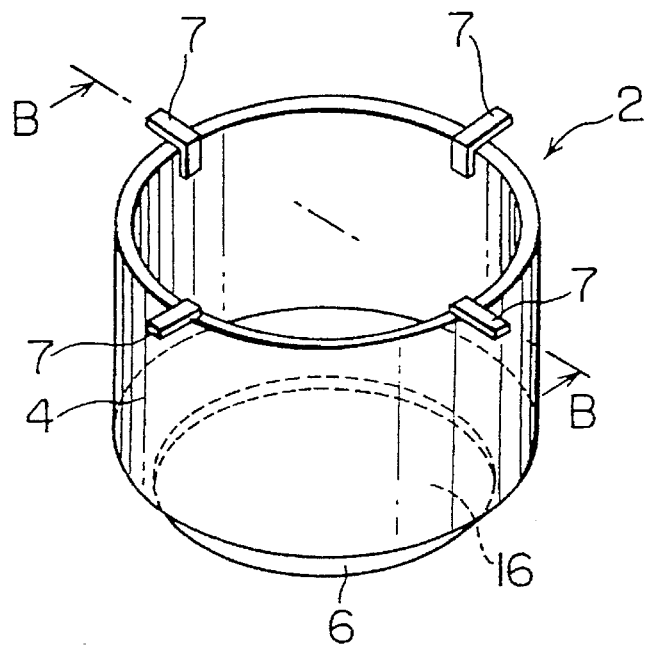
Figure 8:
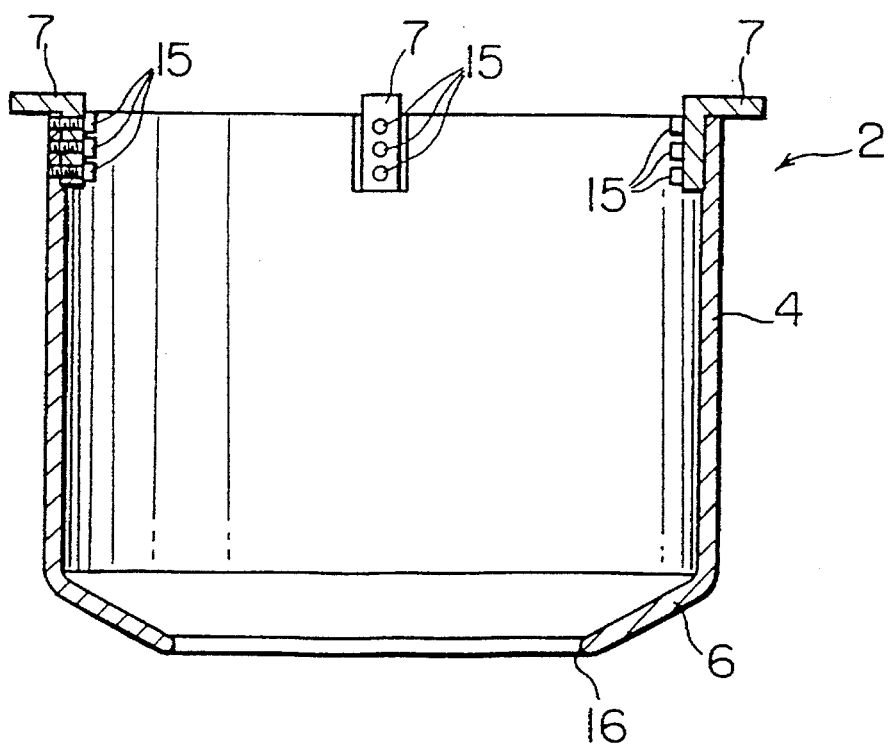
Figure 9:
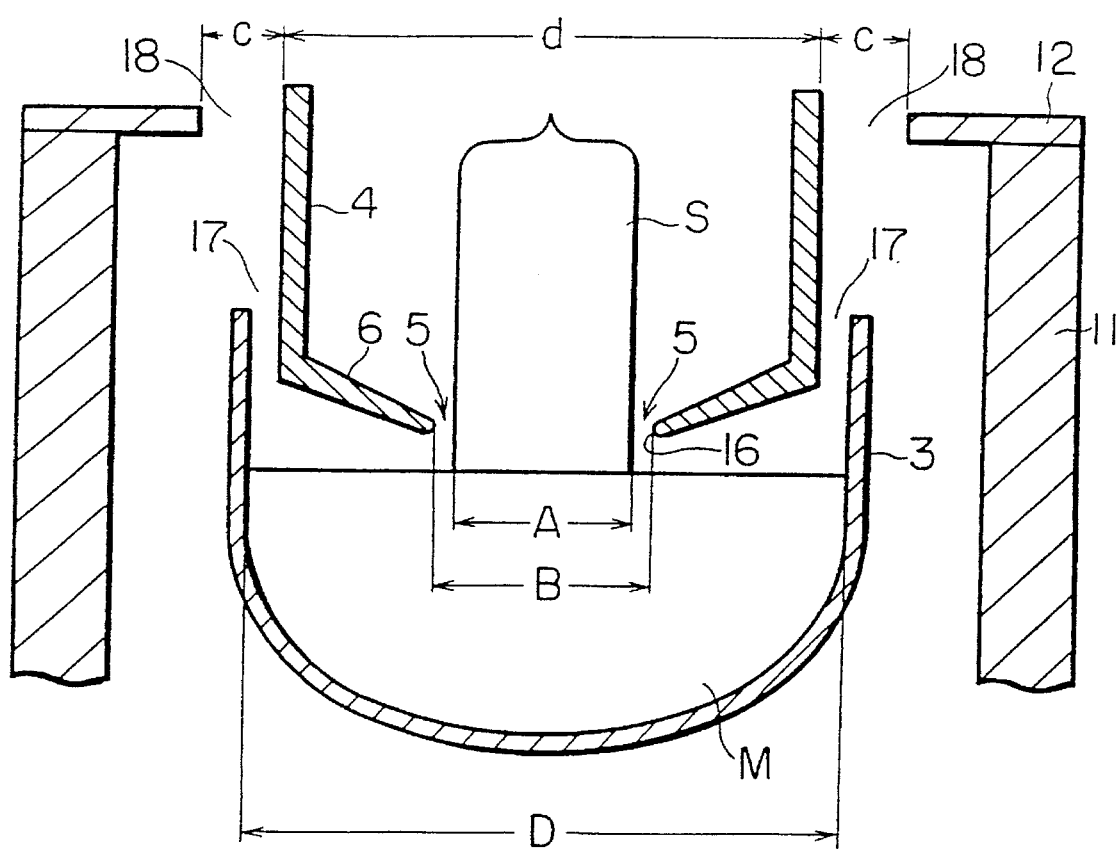
Figure 10:
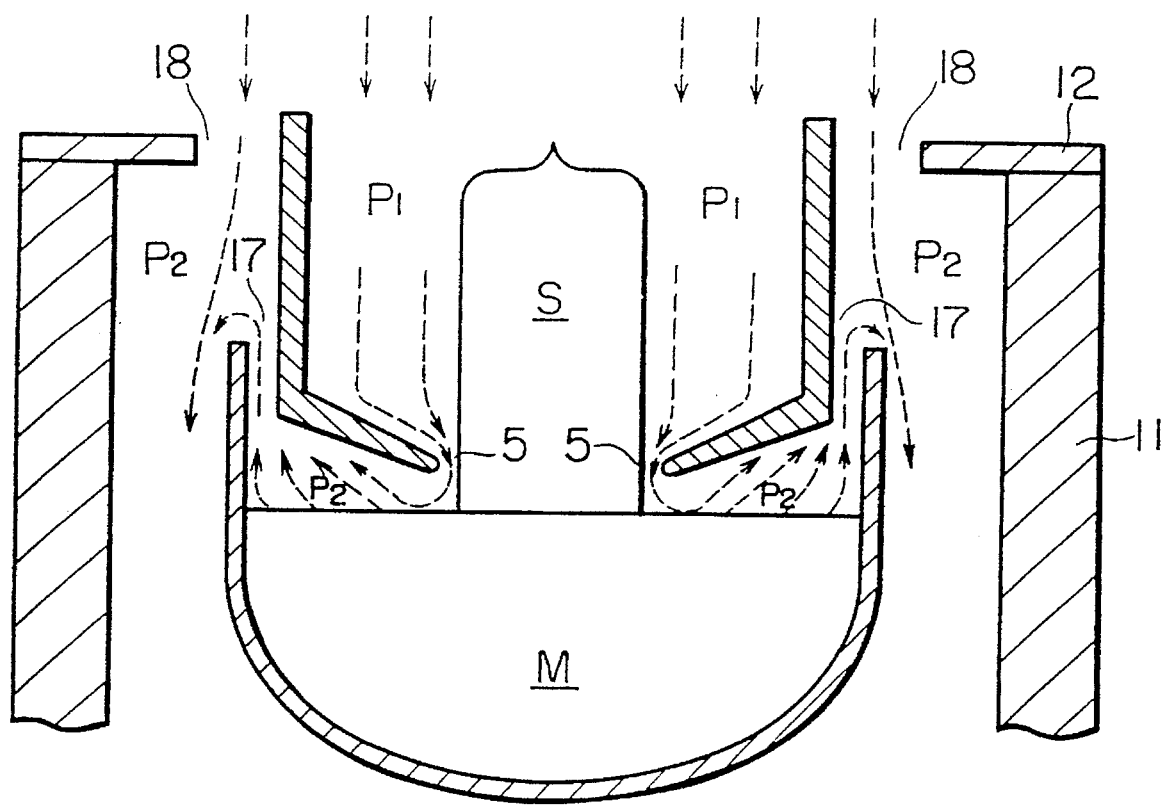
Figure 11:
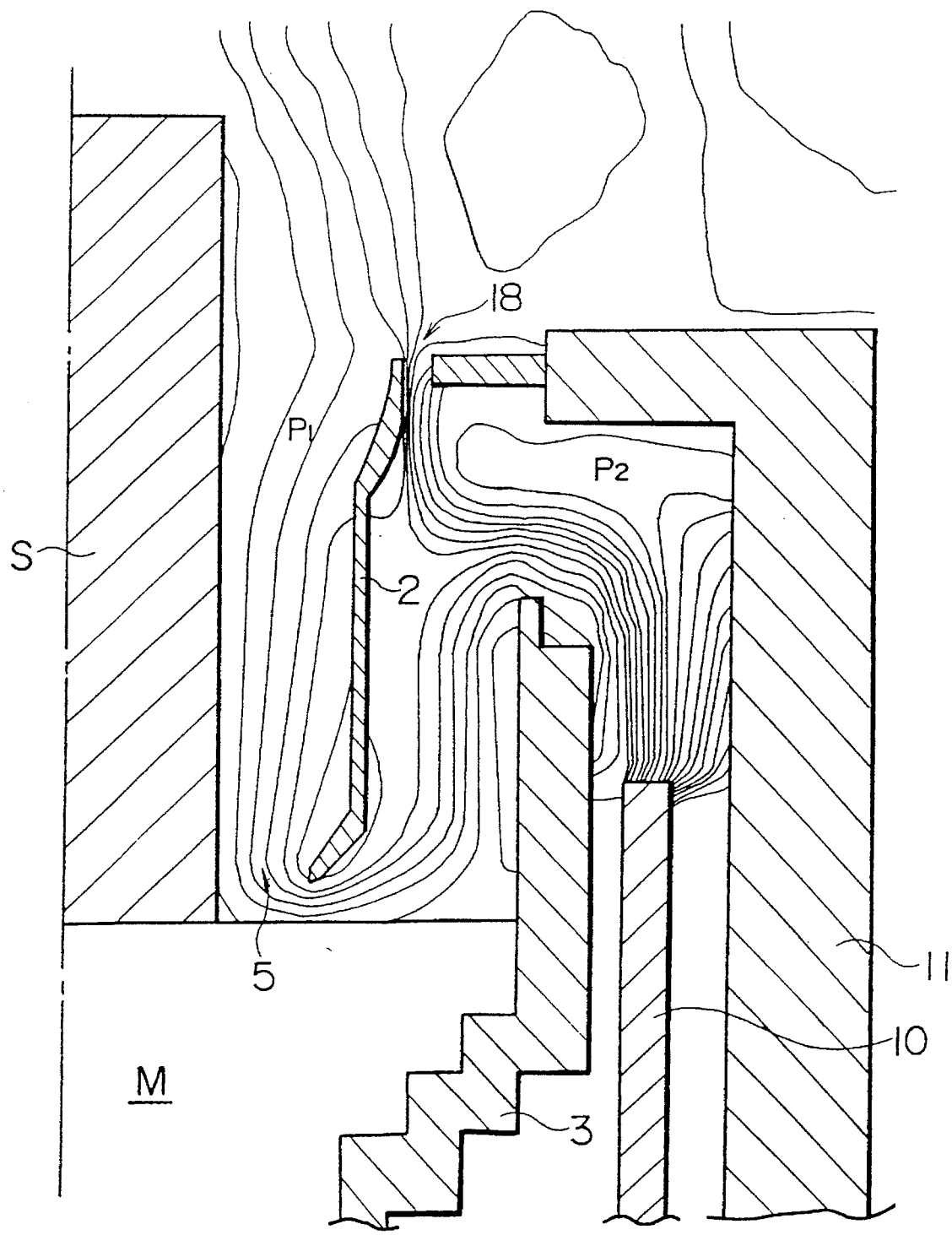
Figure 12:
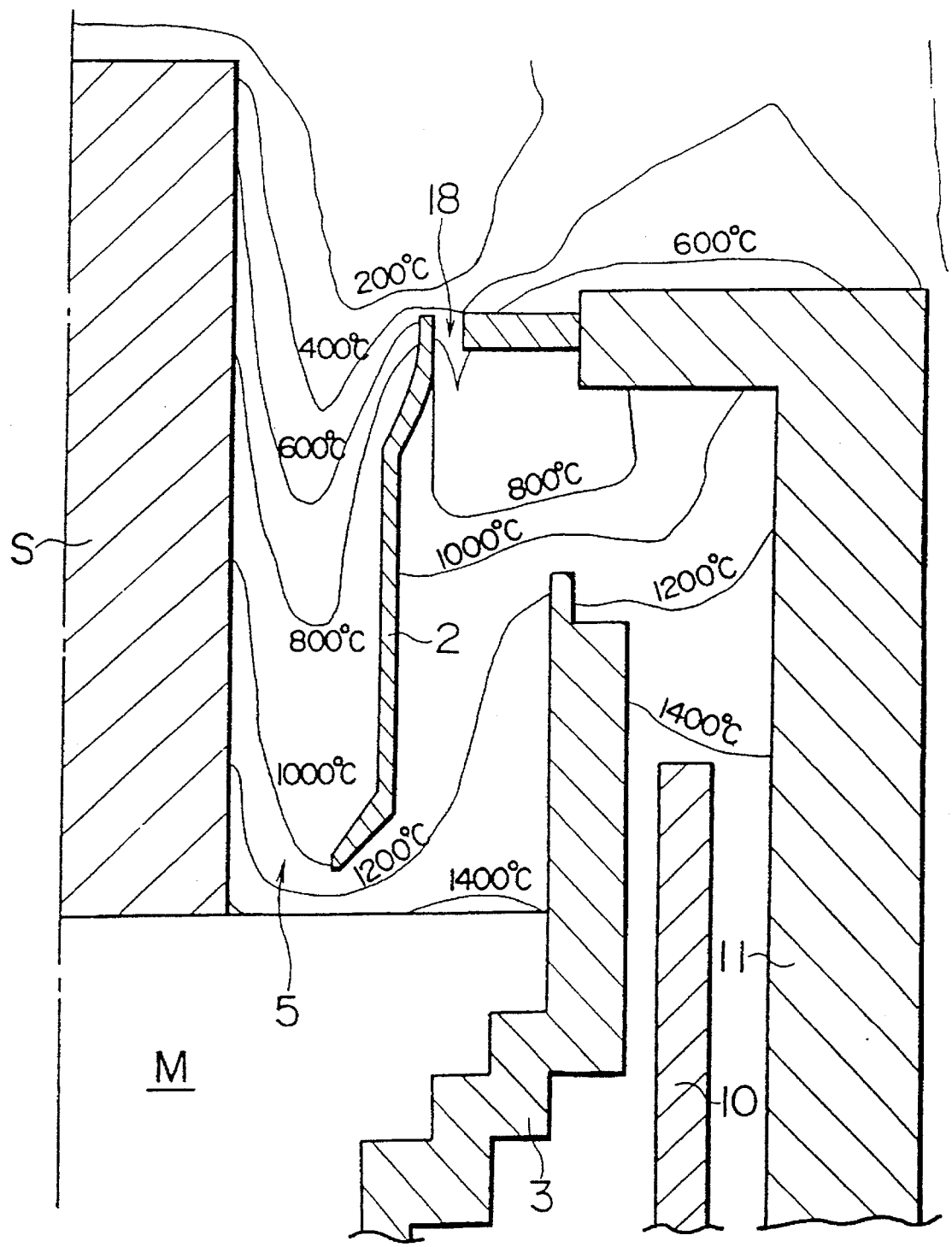
Figure 13:
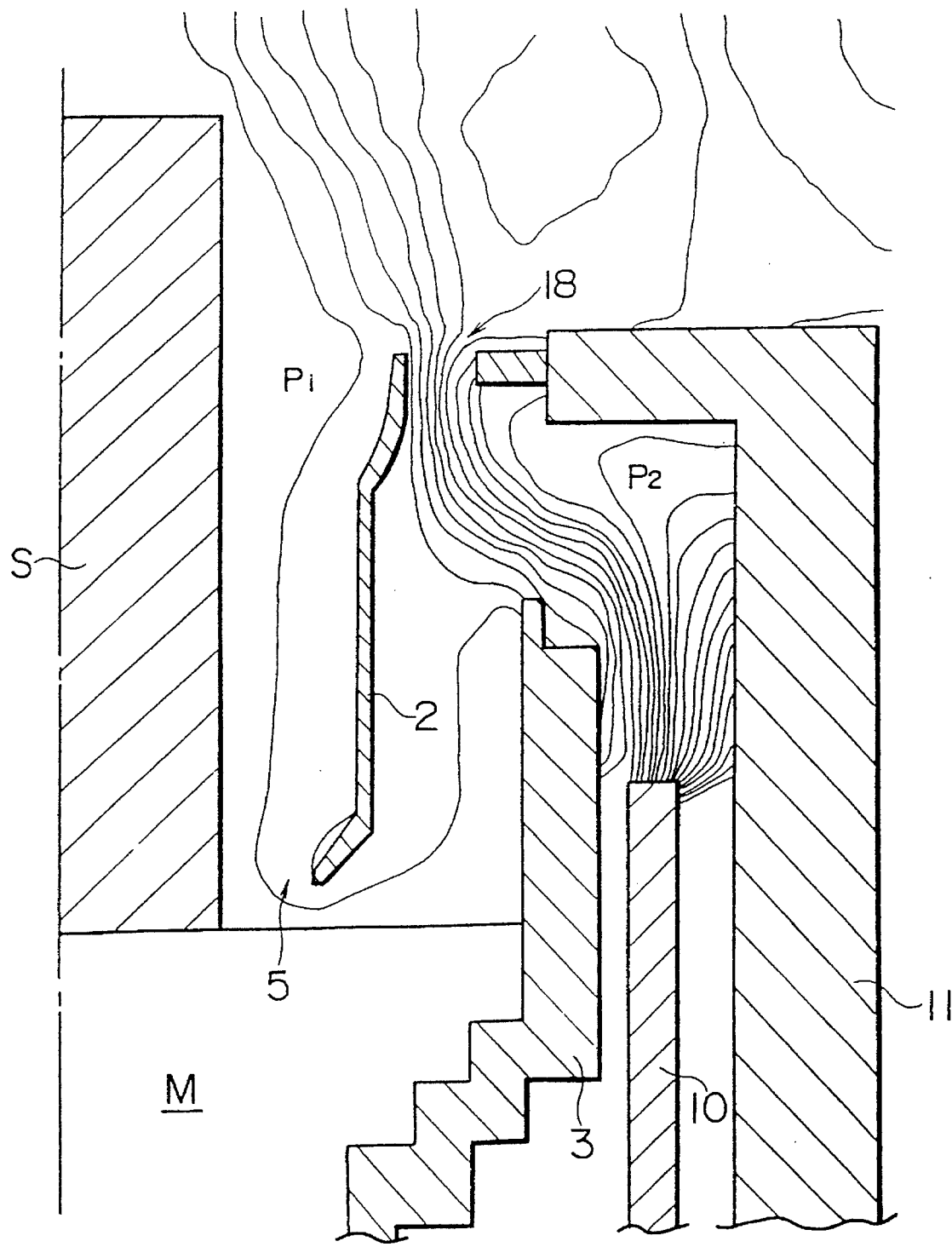
Figure 14:
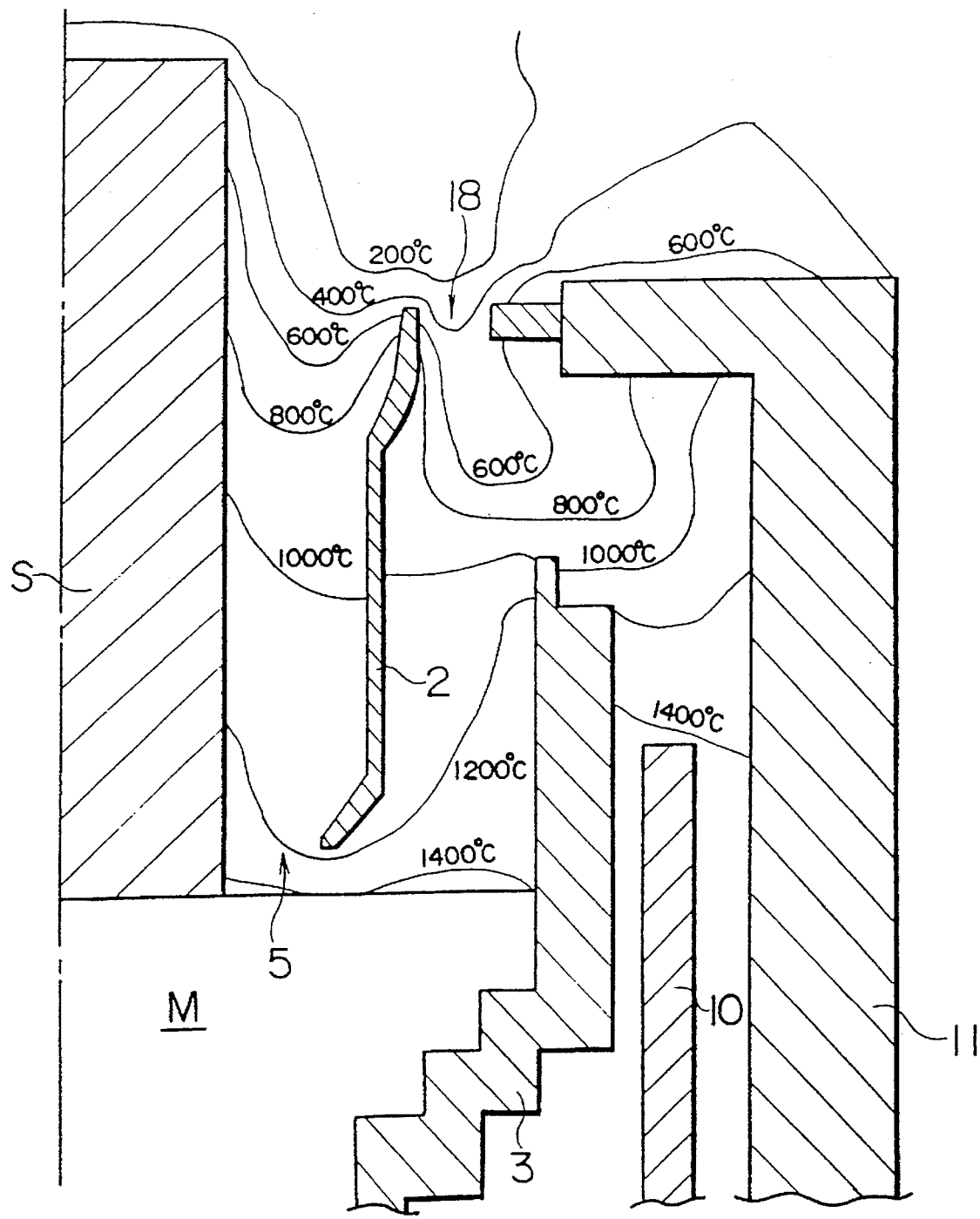
Figure 15A:
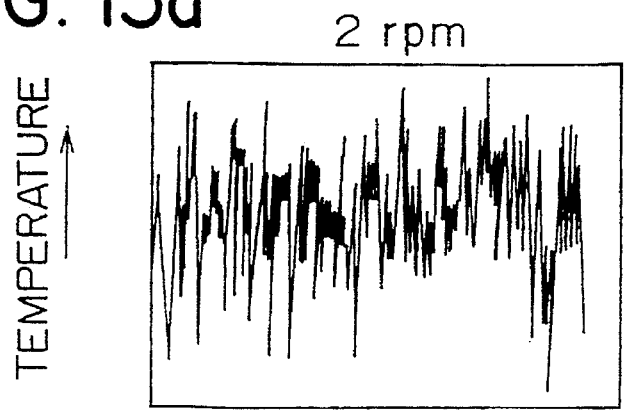
Figure 15B:
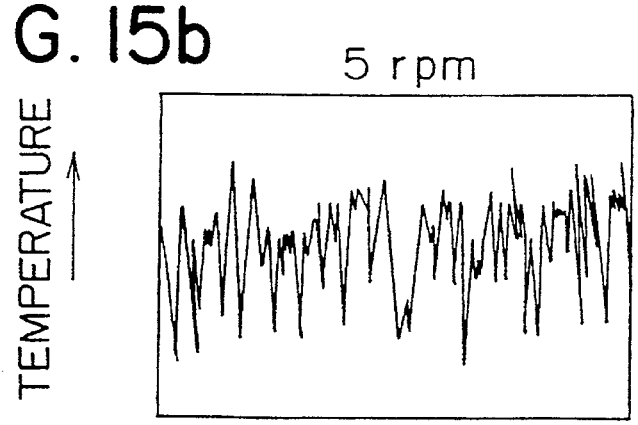
Figure 15C:
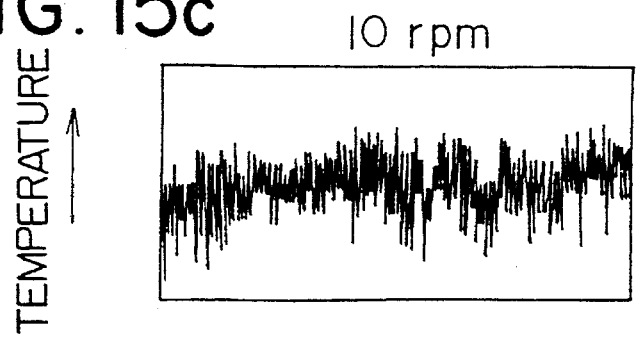
Figure 15D:
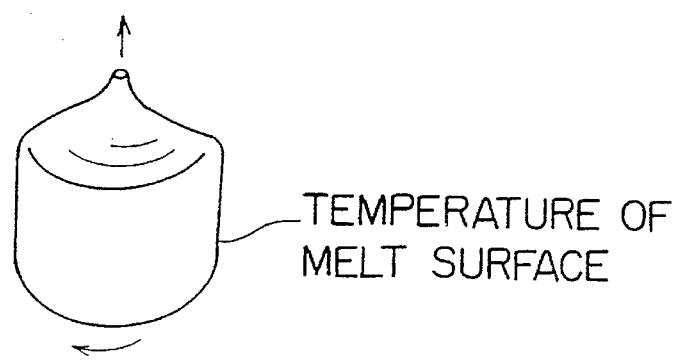
Figure 16:
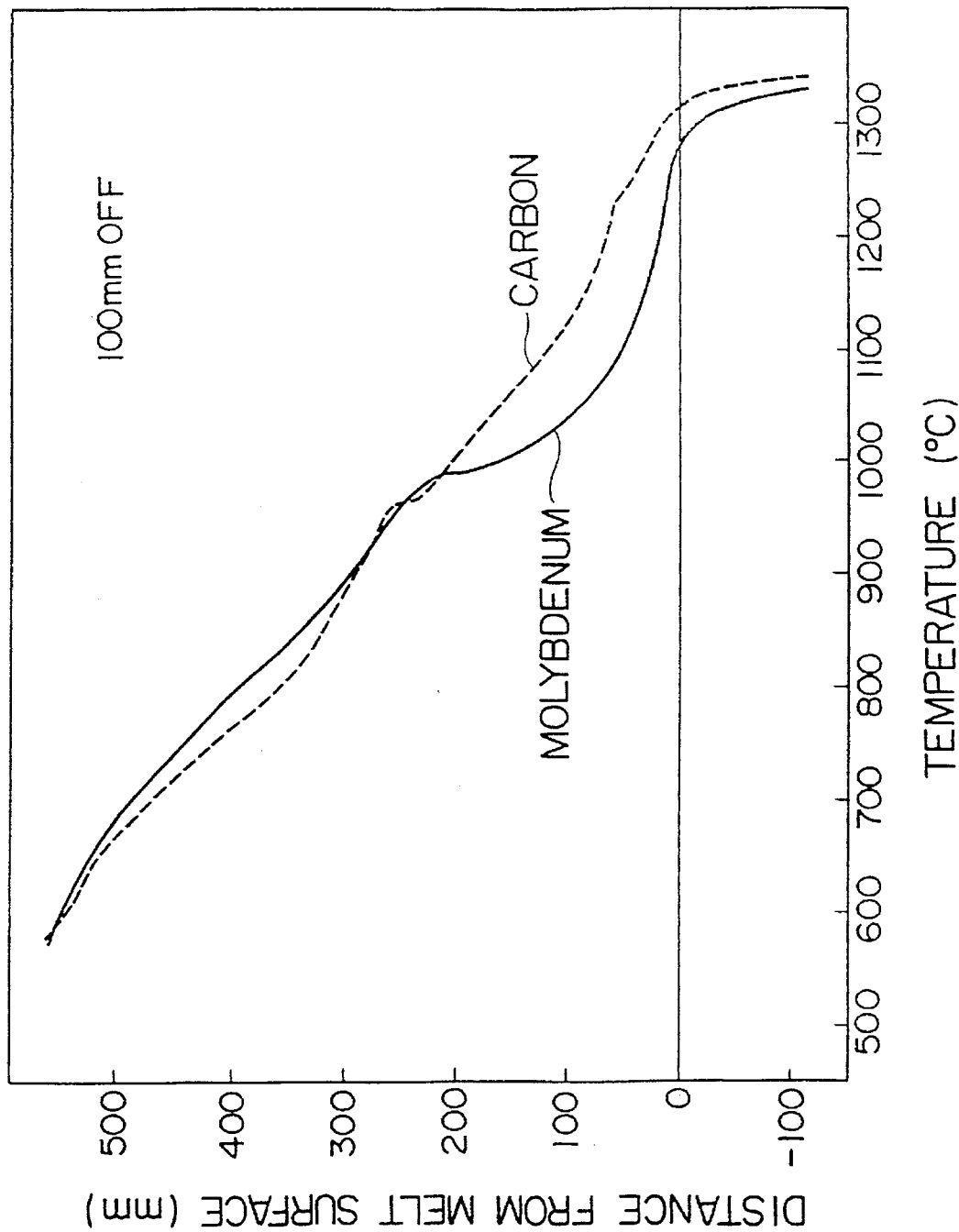
Figure 17:
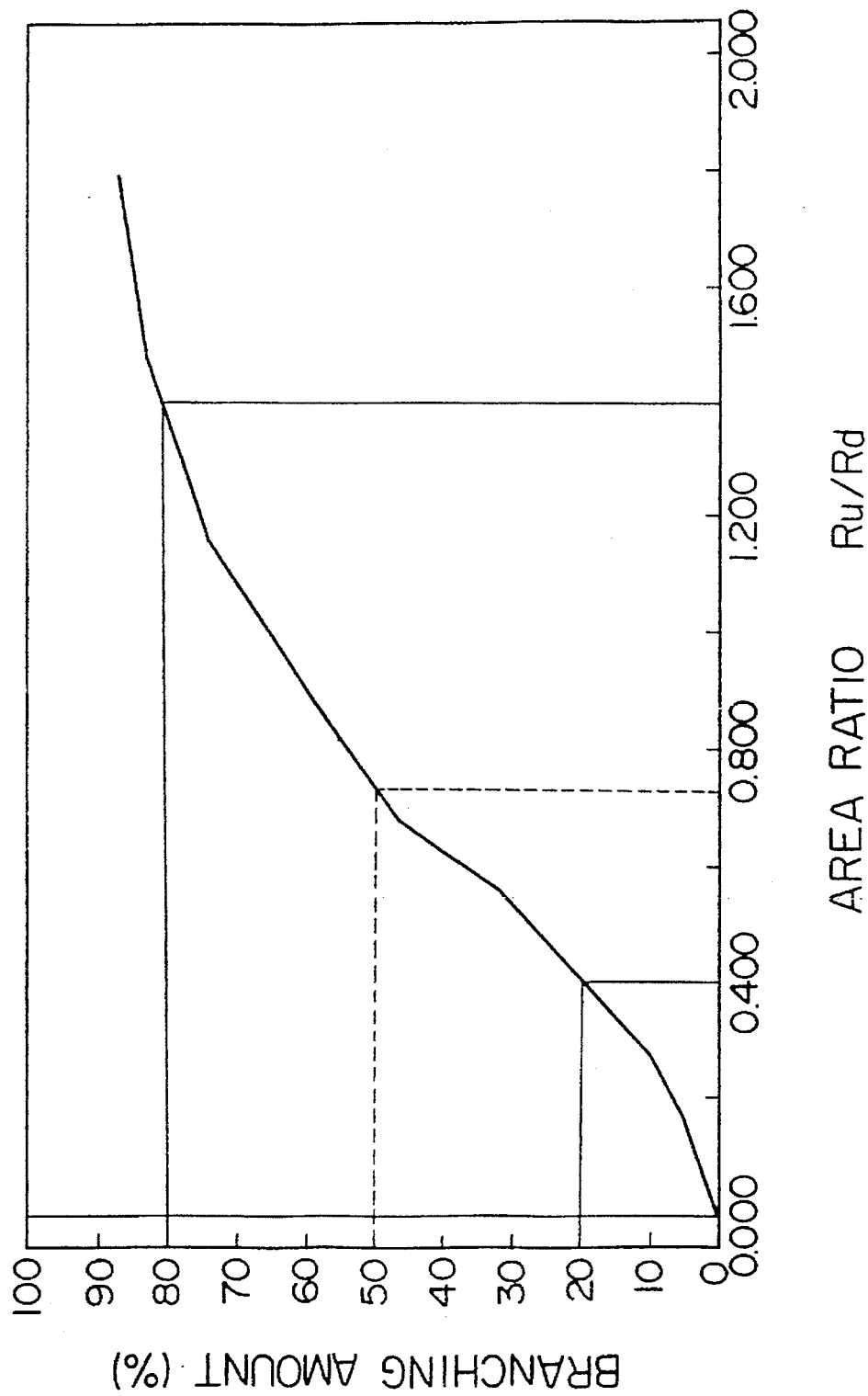

Therefore, the carrier gas flowing down along the inner portion of the flow controller (first flow path) is heated by the carbon flow controller, passes through the gap, then is led to the melt surface without excessively cooling the melt, and promotes the vaporization of the showing the results of analysis by computer simulation of the temperature distribution of the carrier gas using the Navier-Stokes equation for the pulling apparatus shown in FIG. 2;

FIG. 4 is a lateral sectional view showing the pulling apparatus as a whole of a first embodiment of the present invention;

FIG. 5 is a perspective view showing a flow controller according to the embodiment;

FIG. 6 is a sectional view along line A—A of FIG. 5;

FIG. 7 is a perspective view showing a flow controller according to a second embodiment;

FIG. 8 is a sectional view along line B—B of FIG. 7;

FIG. 9 is a sectional view showing the pulling system according to an embodiment of the present invention, which shows the dimensional relationship of the different parts;

FIG. 10 is a sectional view for explaining the flow of a carrier gas in the present invention;

FIG. 11 is a view of the state of flow showing the results of analysis by computer simulation of the state of flow of a carrier gas using the Navier-Stokes equation in the pulling system of the present invention;

FIG. 12 is a view of the temperature distribution showing the results of analysis by computer simulation of the temperature distribution of the carrier gas using the Navier-Stokes equation for the pulling system of FIG. 11;

FIG. 13 is a view of the state of flow showing the results of analysis by computer simulation of the state of flow of the carrier gas using the Navier-Stokes equation for a comparative example of the pulling system shown in FIG. 11;

FIG. 14 is a view of the temperature distribution showing the results of analysis by computer simulation of the temperature distribution of the carrier gas using the Navier-Stokes equation for the pulling system shown in FIG. 13;

FIG. 15a, 15b, 15c, and 15d are each is a graph showing the temperature changes at the melt surface with respect to the rotational speed of the crucible in the pulling system of the present invention;

FIG. 16 is a graph showing the temperature distribution when the material of the flow controller according to the present invention is made carbon and molybdenum; and FIG. 17 is a graph showing the branching of the carrier gas with respect to the ratio of areas of the top gap and bottom gap according to the present invention.

DESCRIPTION OF THE PREFERRED EMBODIMENTS

The pulling system of the present embodiment, as shown in FIG. 4, provides a quartz crucible 3 in a pulling cheer 1. The quartz crucible 3 is attached to a rotatable bottom shaft 9 through a graphite susceptor 8. Further, around the quartz crucible 3 is provided a heater 10 for heating and controlling the temperature of the silicon melt M in the quartz crucible 3. Between the heater 10 and the pulling chamber 1 is provided a heat retaining tube 11.

At the top surface of the heat retaining tube 11 is attached an annular supporting member 12. By placing an engagement portion 7 of a flow controller 2 on the supporting member 12, the flow controller 2 is affixed inside the pulling chamber.

Note that reference numeral 13 denotes a cooling tube for cooling the pulled monocrystal, and reference numeral 14 denotes a peephole for observing the surface of the melt M and the top end edge of the quartz crucible 3.

As shown in FIG. 5, FIG. 6, and FIG. 9, the flow controller 2 according to the present embodiment has an outer diameter d smaller than the inner diameter D of the quartz crucible 3 and is comprised of a tubular portion 4 which extends substantially perpendicularly along the direction of downward flow of the carrier gas G and a constricted diameter portion 6 which constricts in diameter gradually from the bottom end of the tubular portion 4 and forms the small bottom gap 5 with the pulled monocrystal S.

The tubular portion 4 is particularly effective in the case of pulling the monocrystal by the batch-type CZ technique. Namely, the height of the tubular portion 4 in the present embodiment is set so that the area of the opening of the opening 17 becomes constant even if the graphite susceptor 8 is moved up and down between the limit of descent and the limit of rise. Therefore, even if the graphite susceptor 8 rises along with the pulling of the monocrystal, the area of the opening 17 can be held constant, so there is no fluctuation in the flow of the carrier gas G mentioned later.

At the bottom end of the constricted diameter portion 6, an opening 16 is made. This has an opening diameter B in accordance with the diameter A of the pulled monocrystal S and in consideration of the area of the bottom gap 5. With an opening area ($=\pi B^2/4$) less than 1.5 times the crystal area, if the crystal suspended by the wire deviates off center, it may contact the flow controller 2. On the other hand, if greater than 2.0 times, the flow rate of the gas on the melt will fall. Therefore, the area of the opening at the front end of the constricted diameter portion (lateral sectional area) is preferably 1.5 to 2.0 times the area of the pulled monocrystal S (lateral sectional area).

By way of note, the above numerical figures limit the ratio between the area of the opening at the front end of the constricted diameter portion and the lateral sectional area of the monocrystal, but in the flow controller according to the present invention, the same effect is obtained even if the ratio between the area of the bottom gap and the lateral sectional area of the monocrystal is limited. The ratio in this case is 0.5 to 1.0.

The flow controller 2 must withstand high temperatures and not discharge any heavy metal elements since it is directly above the melt. Use is made of a refractory metal like molybdenum(Mo) or tungsten(W) or carbon(C). A refractory metal reflects radiant heat and has a large shielding effect, while carbon absorbs radiant heat and conversely discharges radiant heat to the crystal.

FIG. 16 is a graph showing the results of measurement of the temperature for comparing the effects of radiant heat of molybdenum and carbon at a position 100 mm off from the center of the pulling system.

As shown by this temperature distribution, if use is made of a carbon flow controller, the temperature at the crystal growth interface becomes high, so in the past it was considered that this was detrimental to increasing the pulling speed, but since the crystal quality is considered important now, use of carbon is effective. In addition, a carbon flow controller has the effect of heating the carrier gas flowing through the first flow path $P_1$.

Further, it is preferable that the surface of the carbon flow controller be coated with silicon carbide(SiC). Giving this silicon carbide coating is advantageous to the lifetime of the flow controller 2 and, further, is effective in inhibiting the discharge of the heavy metal elements included in small amounts in the carbon.

The engagement portion 7 for placing the flow controller 2 on the supporting member 12 may be formed integrally with the tubular portion 4 as shown in FIG. 5 and FIG. 6. Further, as shown in FIG. 7 and FIG. 8, the engagement portion 7 may be formed separately and be affixed to the tubular portion 4 by carbon bolts 15.

In the pulling system of this embodiment, by affixing the above-mentioned flow controller 2 inside the pulling chamber 1, the flow paths of the carrier gas G supplied from the top of the pulling chamber I become as follows:

As shown in FIG. 10, first, as the first flow path, there is the flow path $P_1$ in which the carrier gas G branches at the top end of the tubular portion 4 of the flow controller 2 and reaches the inside of the tubular portion 4. Connecting to the first flow path $P_1$, there is the second flow path $P_2$, in which the carrier gas G passes from the first flow path $P_1$ through the gap between the bottom end of the constricted diameter portion 6 and the pulled monocrystal S (hereinafter referred to as the "bottom gap 5") and through the gap between the bottom end of the constricted diameter portion 6 and the surface of the melt M, then passes between the surface of the melt M and the flow controller 2, and further forms the atmosphere including the silicon oxide accompanying the rising air flow between the flow controller 2 and the inner surface 3a of the quartz crucible.

The ratio of the carrier gas G led through the first flow path $P_1$ and the second flow path $P_2$ is related to the areas of the top and bottom gaps, that is, the area Ru of the gap at the outer portion of the tubular portion of the flow controller 2 in the second flow path $P_2$ (hereinafter this gap is referred to as the "top gap 18") and the area Rd of the bottom gap 5 between the constricted diameter portion 6 of the flow controller 2 and the pulled monocrystal S in the first flow path $P_1$, but the carrier gas flowing through the bottom gap 5 encounters the resistance of the rising air flow from the melt, so judging from the results of simulation of the embodiments shown in FIG. 11 and FIG. 13, when the area ratio Ru/Rd is about 0.7, the carrier gas G flows in equal amounts (branching ratio 50%) in the first flow path $P_1$ and the second flow path By way of note, if the branching ratio of the gas flowing through the first flow path $P_1$ is less than 20% of the overall amount, it is not possible to suppress the rising air flow from the melt surface, the silicon oxide deposits on the cooled monocrystal, and, if it condenses and falls, it will ruin the crystal. Conversely, if the branching ratio of the gas flowing through the first flow path $P_1$ is over 80% of the overall amount, the atmosphere including the silicon oxide above the melt surface will not be able to be effectively exhausted. Therefore, in terms of the branching ratio, the carrier gas flowing through the first flow path $P_1$ preferably should be 20% to 80% of the total amount. Converting this to the area ratio Ru/Rd between the top gap 18 and the bottom gap 5, the preferable region of the ratio may be said to be 0.4 to 1.4 (see FIG. 17).

The carrier gas G led into the second flow path $P_2$ is heated by the carbon flow controller 2 and strikes the melt surface M without overcooling the crystal growth interface, replaces the atmosphere including the silicon oxide removed by the carrier gas from the first flow path $P_1$, and diffuses over the melt surface as a whole. This determines the amount of vaporization of the silicon oxide, defines the oxygen concentration of the melt surface from which the crystal is raised, and stabilizes it at the low oxygen side.

Therefore, to obtain a medium oxygen and high oxygen monocrystal, rather than make the bottom gap 5 narrower, the rotational speed of the crucible is rather increased.

If the rotational speed of the crucible is increased, as clear from the temperature change of the melt surface shown in FIG. 15, the stability of the temperature change increases and the stability of the solid-liquid interface increases. In this case, in the state with no flow controller 2, if the rotation of the crystal is not increased so that the ratio of the crystal rotation/crucible rotation becomes constant, numerous crystal faults occur, experience shows, but with this construction, it was confirmed that it was sufficient to make the crystal rotation a maximum of 20 rpm.

Further, as the second flow path $P_2$, there is the flow path in which the carrier gas G supplied from the top of the pulling chamber 1 branches at the top end of the tubular portion 4 of the flow controller 2 and passes through the top gap 18 to flow to the outer portion of the tubular portion 4. The carrier gas G led to this second flow path $P_2$ ends up working with the carrier gas G passing through the first flow path $P_1$ and the other second flow path $P_2$ to function to exhaust the silicon oxide outside the system and, further, has the following functions:

When the carrier gas G branching at the top end of the tubular portion 4 of the flow controller 2 and passing through the top gap 18 to be led into the second flow path $P_2$ flows down along the outer surface of the flow controller 2 and then flows further down along the outer surface of the graphite susceptor 8, that is, when passing through the opening 18 between the graphite susceptor 8 and the flow controller 2, it sweeps up the atmosphere including the silicon oxide at the outside of the flow controller 2 by the aspiration effect and reduces the air pressure.

Therefore, the silicon oxide vaporizing from the surface of the melt M is exhausted outside of the quartz crucible 3 along with the large energy gas from the flow path $P_1$, so will not condense and solidify at the top of the flow controller facing the melt and fall into the melt. As a result, the yield of the monocrystal is improved.

Since the atmosphere including the silicon oxide is exhausted in this way from the second flow path $P_2$ by the aspiration effect, the carrier gas G led to the first flow path $P_1$ uniformly contacts the entire surface of the melt M as rectified.

Therefore, the amount of vaporization of the silicon oxide vaporizing from the melt surface becomes uniform and it becomes possible to suppress the adverse effects on the oxygen concentration caused by turbulence of the carrier gas G, that is, to improve the oxygen distribution (ORG) in the wafer surface of the pulled monocrystal.

Further, the carrier gas G supplied from the top of the pulling chamber 1 branches into the first flow path $P_1$ and the second flow path $P_2$ at the top end of the tubular portion 4 of the flow controller 2, so for example if the resistance through the first flow path $P_1$ fluctuates, there is a function of absorbing that fluctuation. That is, when the monocrystal S is started to be pulled, the top of the pulled monocrystal S is still not positioned at the constricted diameter portion 6 of the flow controller 2, so the gap dimension of the bottom gap 5 is large.

In this way, the flow area of the first flow path $P_1$ is large, so a large amount of carrier gas G is led to the first flow path $P_1$. When the monocrystal S is pulled, the pulled monocrystal rises to the inside of the flow controller 2 and the flow area rapidly becomes smaller.

By this, the flow resistance of the first flow path $P_1$ rapidly increases, the flow rate of the carrier gas G passing through the bottom gap 5 becomes faster, and the top of the pulled monocrystal S becomes relatively high in oxygen concentration, but in the present invention, an amount of carrier gas G equal to the increase in the flow resistance of the bottom gap 5 is led into the second flow path $P_2$, so as a result the flow rate of the carrier gas G passing through the bottom gap 5 does not fluctuate that much.

When there is no branching, with a closed heat cap disclosed in U.S. Pat. No. 4,330,362, if the clearance of the bottom gap is made larger, the cooling of the melt surface decreases, vaporization of the silicon oxide is promoted, and a low oxygen concentration results. In a construction as with the flow controller of the present invention, however, where the gas branches to the first flow path $P_1$ and the second flow path $P_2$, the flow rate does not fluctuate that much, so it becomes unnecessary to finely adjust the bottom gap and otherwise be strict in the settings. Therefore, the distribution of the oxygen concentration in the axial direction of the pulled monocrystal S becomes constant.

After this, the rotation of the crucible is adjusted to control the oxygen concentration.

However, to pull a large diameter, high quality monocrystal without overly reducing the pulling speed, it is necessary to lengthen the region of over 1300° C. near the crystal growth interface. To achieve this, it is advantageous to reduce the flow of the carrier gas or to raise the temperature. Therefore, in the present invention, an effect can be expected by having the radiant heat from the melt received by the carbon flow controller 2 and re-radiated to the pulled monocrystal. Further, after passing this region, it is possible to efficiently produce the high quality monocrystal by raising the cooling ability of the pulled monocrystal by the top water cooling tube.

In addition to this, the melt surface near the inner peripheral wall of the quartz crucible 3 is not covered by the flow controller 2, so by observing the melt surface from a peephole 14 etc. provided in the pulling chamber 1, it is possible to quickly deal with any heat deformation in the top end of the quartz crucible 3, recrystallization or silicon deposition near the inner peripheral wall of the quartz crucible 3, or other problems when they occur.

Further, when pulling a monocrystal by the batch type CZ technique, the graphite susceptor 8 on which the quartz crucible 3 is carried is raised in accordance with the pulling of the monocrystal S so as to maintain the dimensions of the bottom gap. In the flow controller 2 of the present embodiment, a carbon flow controller 2 absorbs the heat irradiated from the melt surface, then radiates that heat to the pulled monocrystal. Considering this, the tubular portion 4 is formed in the flow controller 2 so that the temperature will not fall to the extent where silicon oxide condenses. Therefore, even if the quartz crucible 3 and the graphite susceptor 8 are raised, the gap formed between the tubular portion 4 and the inner surface of the quartz crucible 3, that is, the area of the opening of the opening 18, can be maintained constant. Consequently, even if the quartz crucible 3 rises, there is no fluctuation caused in the flow of the carrier gas G passing through.

The present invention will be explained in further detail to help the effect of the flow controller to be understood.

FIG. 17 is a graph showing the branching of the carrier gas with respect to a ratio Ru/Rd of the bottom gap area Rd and the top gap ratio Ru. In the figure, when the area ratio Ru/Rd is 0.4, the flow of the first flow path becomes 20% while when it is 1.4, the flow of the first flow path becomes 80%.

At this time, if the area ratio Ru/Rd is smaller than 0.4, the crystal is overcooled and a high quality crystal cannot be obtained. Further, if the area ratio Ru/Rd is over 1.4, the carrier gas flowing through the first flow path becomes too little, so the gas including silicon oxide from the bottom gap rises and adheres to the top of the crystal. This condenses and falls into the melt, thereby creating the problem of the ruining of the monocrystal.

This relationship will be explained with reference to a pulling apparatus for a 6 inch crystal.

First, the crystal diameter A is 156 mm and the constricted diameter portion opening B of the flow controller is 210 mm, so the ratio of the area of the opening to the area of the crystal becomes 1.8.

Further, the area Rd of the bottom gap after the pulled monocrystal passes through the opening of the constricted diameter portion of the flow controller becomes 15,523 mm$^2$. The diameter d of the tubular portion of the flow controller is 342 mm, the opening width C is 12 mm, and the width of the engagement portion 7 is 60 mm, so the area of the top gap 18 is 10,465 mm$^2$. Therefore, the area ratio Ru/Rd becomes 0.67. Using such a pulling system, monocrystals were produced under conditions of 40 nl/min of argon gas and 10 to 20 Torr of vacuum. The standard deviations in the target of the oxygen concentrations were as shown in Table 1. It was possible to obtain the monocrystals aimed for in the present invention.

TABLE 1

| Standard Deviation in Oxygen Concentrations | | | |
|---|---|---|---|
| Class | Target value | Power | Standard deviation |
| Low oxygen | $1.15 \times 10^{18}$ | 121 | 0.062 |
| Medium oxygen | $1.35 \times 10^{18}$ | 221 | 0.044 |
| High oxygen | $1.55 \times 10^{18}$ | 110 | 0.039 |

The embodiments explained above were described to facilitate the understanding of the present invention and were not meant to limit the present invention in any way. Therefore, the elements disclosed in the above embodiment include all design modifications and equivalents falling under the technical scope of the present invention.

As explained above, according to the present invention, control of the concentration of oxygen in the pulled monocrystal is possible, achievement of a uniform oxygen distribution (ORG) in the wafer surface is possible, it is possible to pull a monocrystal with a uniform oxygen concentration with respect to the axial direction, and it is possible to pull a high quality monocrystal having a particularly large diameter.

We claim:

1. A silicon oxide exhaust method for guiding a carrier gas, supplied from the top of a pulling chamber for pulling up a monocrystal according to the Czochralski technique, to a surface of a melt of a material for forming a monocrystal and exhausting to the outside of said pulling chamber silicon oxide vaporized from the surface of the melt accommodated in a crucible, said silicon oxide exhaust method comprising defining by a carrier gas branching means a bottom gap between a circumference of the pulled monocrystal and the surface of said melt and defining a top gap between said crucible and a heat retaining tube provided at the outside of the same, defining a first flow path through which said carrier gas flows toward said bottom gap between said carrier gas branching means and pulled monocrystal, defining a second flow path comprised of a flow path of the carrier gas passing through said top gap and a flow path of said carrier gas passing from said first flow path through said bottom gap and then passing between the surface of said silicon melt and a flow controller, forming the bottom gap and the top gap so that the amount of the carrier gas flowing through said bottom gap becomes greater than the amount of the carrier gas flowing through said top gap, and exhausting said silicon oxide together with said carrier gas through said second flow path to the outside of the pulling chamber.

2. A silicon oxide exhaust method as set forth in claim 1, wherein said crucible is heated by a heating means arranged between said crucible and said heat retaining tube and a gap is formed between said heating means and said heat retaining tube, said gap is connected to said second flow path, and said silicon oxide is exhausted together with said carrier gas to the outside of said pulling chamber through said gap.

3. A silicon oxide exhaust method as set forth in claims 2, wherein a portion of said top gap is positioned to the inside of the top end of the crucible.

4. A silicon oxide exhaust method as set forth in claim 1, wherein a diameter of the carrier gas branching means near the surface of the melt solution is constricted and an area of the opening of the constricted diameter portion is 1.5 to 2.0 times the sectional area of the pulled monocrystal.

5. A silicon oxide exhaust method as set forth in claim 1, wherein a sectional area (Ru) of said top gap is 0.5 to 1.4 times the sectional area (Rd) of the bottom gap.

6. A monocrystal pulling method as set forth in claims 1, wherein a relative rotational speed of the crucible or the pulled monocrystal is controlled so as to control the concentration of oxygen included in said monocrystal.

* * * * *